US012132348B2

(12) United States Patent
Liao et al.

(10) Patent No.: US 12,132,348 B2
(45) Date of Patent: Oct. 29, 2024

(54) DUAL POWER SWITCHING SYSTEM AND METHOD OF CONTROLLING THE SAME

(71) Applicant: DELTA ELECTRONICS, INC., Taoyuan (TW)

(72) Inventors: Jen-Chuan Liao, Taoyuan (TW); Chien-Chih Chan, Taoyuan (TW); Jia-Cheng Sie, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 21 days.

(21) Appl. No.: 18/164,488

(22) Filed: Feb. 3, 2023

(65) Prior Publication Data

US 2024/0063656 A1    Feb. 22, 2024

(30) Foreign Application Priority Data

Aug. 17, 2022  (CN) .......................... 202210985413.4
Nov. 30, 2022  (CN) .......................... 202211516426.3

(51) Int. Cl.
  *H02J 9/06*   (2006.01)
  *G01R 31/40*  (2020.01)
  *G01R 33/02*  (2006.01)

(52) U.S. Cl.
  CPC .............. *H02J 9/068* (2020.01); *G01R 31/40* (2013.01); *G01R 33/02* (2013.01)

(58) Field of Classification Search
  CPC .......... H02J 9/068; G01R 31/40; G01R 33/02
  (Continued)

(56) References Cited

U.S. PATENT DOCUMENTS 5,808,378 A     9/1998  O'Leary
6,977,448 B2 *  12/2005 Kanouda ................. H02J 9/061
                                                    307/64

(Continued)

FOREIGN PATENT DOCUMENTS

CN      1918769 B    9/2011
CN    102820699 A   12/2012

(Continued)

OTHER PUBLICATIONS

Search Report dated Sep. 13, 2023 of the corresponding European patent application No. 23155226.6.

(Continued)

*Primary Examiner* — Michael R. Fin
(74) *Attorney, Agent, or Firm* — Muncy, Geissler, Olds & Lowe, P.C.

(57) ABSTRACT

A dual power switching system includes a first STS, a second STS, an inductive device, and a controller. The first STS is electrically coupled to a main power source, and the second STS is electrically coupled to a backup power source. When detecting that the main power source is abnormal, the controller detects a residual magnetic flux of the inductive device and calculates a magnetic flux difference between the predicted magnetic flux and the residual magnetic flux. When determining that an absolute value of the magnetic flux difference is less than or equal to a magnetic flux deviation value, the controller determines whether the output power meets a forced commutation condition. When determining that the output power meets the forced commutation condition, the controller turns on the second STS so that the first STS is forcibly turned off by the backup power source through the second STS.

15 Claims, 12 Drawing Sheets

(58) Field of Classification Search
USPC .................................................. 307/64, 104
See application file for complete search history.

(56) References Cited

U.S. PATENT DOCUMENTS

| | | | |
|---|---|---|---|
| 7,459,804 | B2 | 12/2008 | Marwali et al. |
| 9,520,874 | B2 | 12/2016 | Bush et al. |
| 11,682,920 | B1 | 6/2023 | Zhang et al. |
| 2005/0184591 | A1 | 8/2005 | Marwali et al. |
| 2005/0184592 | A1 | 8/2005 | Marwali et al. |
| 2017/0126006 | A1 | 5/2017 | Pfitzer et al. |
| 2021/0288518 | A1* | 9/2021 | Budde .................. H02J 9/062 |

FOREIGN PATENT DOCUMENTS

| | | |
|---|---|---|
| CN | 103812308 B | 9/2017 |
| CN | 108432077 A | 8/2018 |
| CN | 109787347 A | 5/2019 |
| WO | 2005078893 A1 | 8/2005 |

OTHER PUBLICATIONS

Search Report dated Oct. 8, 2023 of the corresponding PCT patent application No. PCT/CN2023/099543.
Liu, Zheng-hai, *Design and R&D of Static Transfer Switch Controller*, Thesis document for the Degree of Master of Engineering, Jiangsu University of Science and Technology, 2013, 90 pages.

* cited by examiner

DUAL POWER SWITCHING SYSTEM AND METHOD OF CONTROLLING THE SAME

BACKGROUND

Technical Field

The present disclosure relates to a dual power switching system and a method of controlling the same, and more particularly to a dual power switching system and a method of controlling the same for avoiding improper switching.

Description of Related Art

The statements in this section merely provide background information related to the present disclosure and do not necessarily constitute prior art.

A static transfer switch apparatus (STS) is an essential component in the configuration of a data center power system, providing uninterrupted power for a critical load 121, and the STS usually includes multiple silicon-controlled rectifiers. The architecture of the STS apparatus is shown in FIG. 1A, and the STS apparatus is usually powered by two or more independent power sources. Once the preferred main power source 110 is out of the acceptable range, it will automatically switch from the preferred power source to the backup power source 111 to provide an uninterruptible power supply to uninterruptedly and continuously supply power to the critical equipment and avoid interrupting power supply to the critical equipment and forcibly shutting down the critical equipment.

Typically, the output of the STS apparatus is connected to the critical equipment through a transformer, and since the transformer is an inductive device 120, there is a problem of magnetic flux saturation. As shown in FIG. 1B, if the main power source 110 is out of acceptable range (time t1), and improper switching between the two power sources (time t2), a high inrush current Ii may be induced in the downstream transformer. When the inrush current Ii is too high, it can overload the upstream circuit or trip the circuit breaker, thereby causing the entire system to lose power. Therefore, in a conventional power switching method, after the current flowing through the silicon-controlled rectifier of the main power source drops to zero, the silicon-controlled rectifier of the backup power source is turned on so as to avoid excessive inrush current Ii. However, this switching method will need to wait for the current to drop to zero, resulting in too long waiting time and resulting in too low output voltage, which may still lead to the risk of forced shutdown of the critical equipment.

SUMMARY

In order to solve the above-mentioned problem, the present disclosure provides a dual power switching system. The dual power switching system includes a first static transfer switch, a second static transfer switch, an inductive device, and a controller. The first static transfer switch is electrically coupled to a main power source. The second static transfer switch is electrically coupled to a backup power source. The inductive device includes a first side winding and a second side winding. The first side winding is electrically coupled to the first static transfer switch and the second static transfer switch, and the second side winding is electrically coupled to a load. The controller detects an output power of the main power source and an output power of the backup power source, and acquires a predicted magnetic flux corresponding to the inductive device. When the controller detects that the main power source is abnormal, the controller detects a residual magnetic flux of the inductive device and calculates a magnetic flux difference between the predicted magnetic flux and the residual magnetic flux. When the controller determines that an absolute value of the magnetic flux difference is less than or equal to a magnetic flux deviation value, the controller determines whether the output power meets a forced commutation condition. When the controller determines that the output power meets the forced commutation condition, the controller turns on the second static transfer switch so that the first static transfer switch is forcibly turned off by the backup power source through the second static transfer switch.

In order to solve the above-mentioned problem, the present disclosure provides a dual power switching system. The dual power switching system includes a first static transfer switch, a second static transfer switch, an inductive device, a forced commutation circuit, and a controller. The first static transfer switch is electrically coupled to a main power source. The second static transfer switch is electrically coupled to a backup power source. The inductive device includes a first side winding and a second side winding. The first side winding is electrically coupled to the first static transfer switch and the second static transfer switch, and the second side winding is electrically coupled to a load. The forced commutation circuit is electrically coupled to the first static transfer switch and the second static transfer switch. The controller detects an output power of the main power source and an output power of the backup power source, and acquires a predicted magnetic flux corresponding to the inductive device. When the controller detects that the main power source is abnormal, the controller detects a residual magnetic flux of the inductive device and calculates a magnetic flux difference between the predicted magnetic flux and the residual magnetic flux. When the controller determines that an absolute value of the magnetic flux difference is less than or equal to a magnetic flux deviation value, the controller activates the forced commutation circuit to provide a reverse-bias voltage to forcibly turn off the first static transfer switch, and after the first static transfer switch is forcibly turned off, the controller turs on the second static transfer switch.

In order to solve the above-mentioned problem, the present disclosure provides a method of controlling a dual power switching system. The dual power switching system includes a main power source, a static transfer switch apparatus, and a backup power source. The method includes steps of: electrically conducting an inductive device by the main power source through the static transfer switch apparatus by operating the static transfer switch apparatus, and suppling power of the main power source to a load electrically coupled to the inductive device, detecting an output power of the main power source and an output power of the backup power source, and acquiring a predicted magnetic flux corresponding to the inductive device, detecting a residual magnetic flux of the inductive device and calculating a magnetic flux difference between the predicted magnetic flux and the residual magnetic flux when the main power source is abnormal, determining whether the output power meets a forced commutation condition when an absolute value of the magnetic flux difference is less than or equal to a magnetic flux deviation value, electrically conducting the inductive device by the backup power source through the static transfer switch apparatus by operating the static transfer switch apparatus when the output power meets the forced commutation condition, and driving the static transfer switch apparatus by the backup power source to forcibly disconnect a path between the main power source and the inductive device.

The main purpose and effect of the present disclosure is that the controller is used to continuously calculate the predicted magnetic flux acquired in the downstream inductive device in real time. If a power failure event occurs, the controller shuts down (turns off) the silicon-controlled rectifiers on the working path of the main power source. The silicon-controlled rectifiers on the backup power path are then turned on according to the current calculated magnetic flux, and according to the specific timing designed by the present disclosure so as to avoid improper switching between the two power sources causing high inrush currents in downstream inductive device. At the same time, it avoids the situation that the output power is too low to maintain the stable operation of the load due to waiting for the freewheeling current of the silicon-controlled rectifiers to reach zero.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1A:
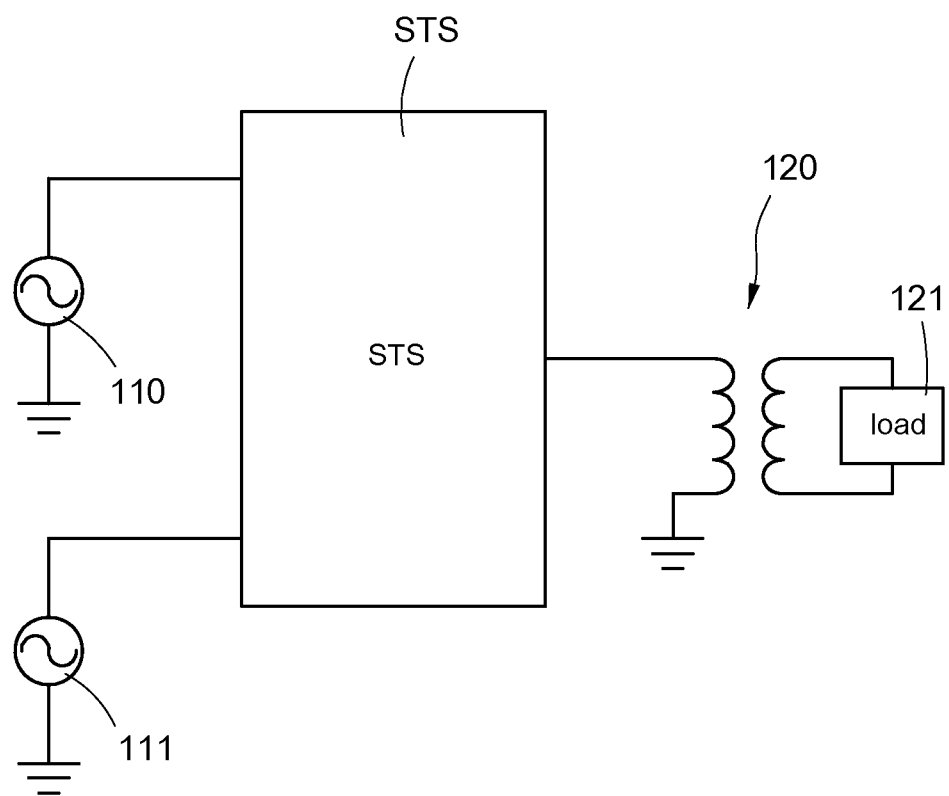
FIG. 1A is a block circuit diagram of a static transfer switch (STS) apparatus of a related art.
Figure 1B:
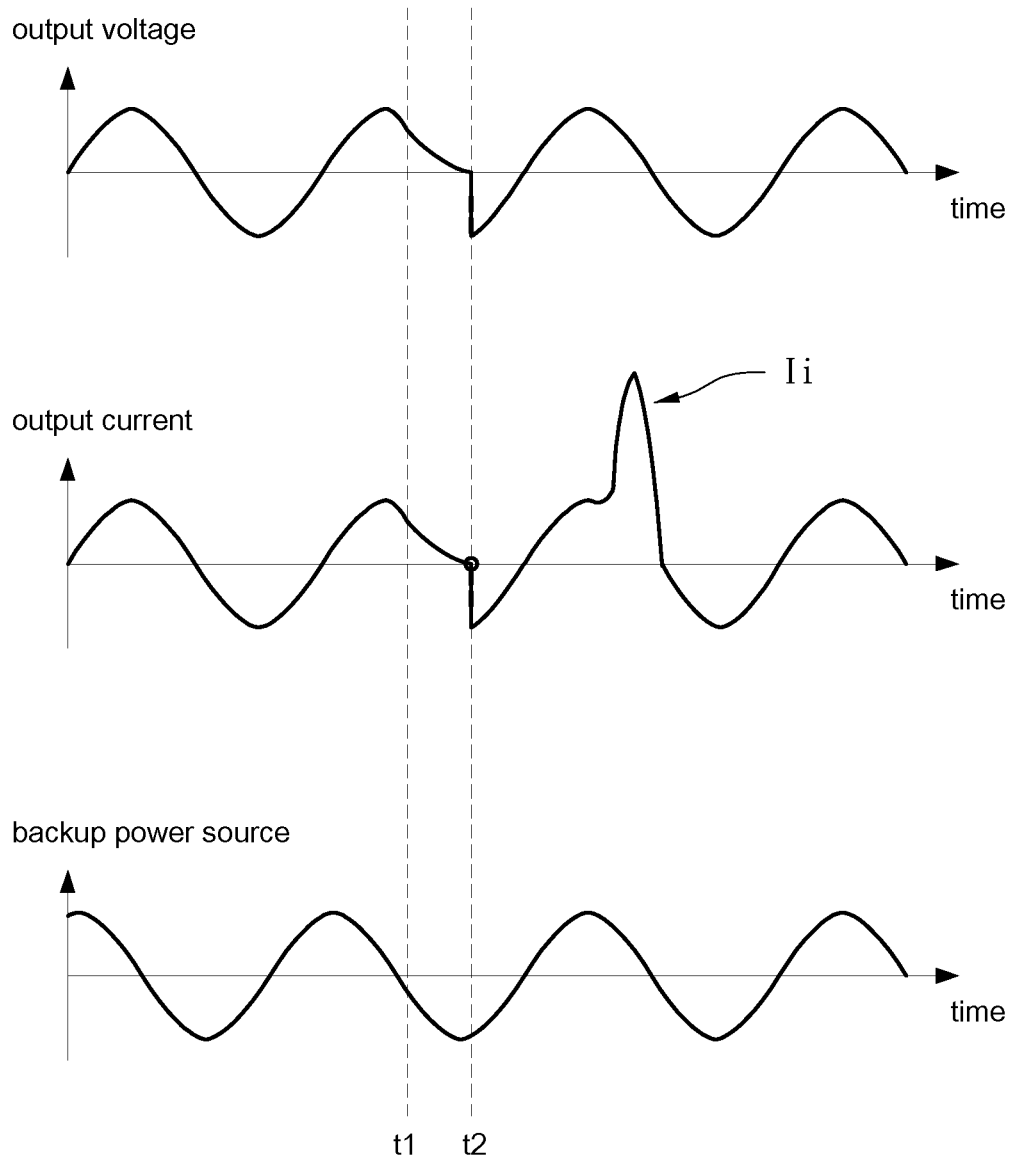
FIG. 1B is a waveform of the STS apparatus of the related art.

Reference will now be made to the drawing figures to describe the present disclosure in detail. It will be understood that the drawing figures and exemplified embodiments of present disclosure are not limited to the details thereof.

Figure 2A:
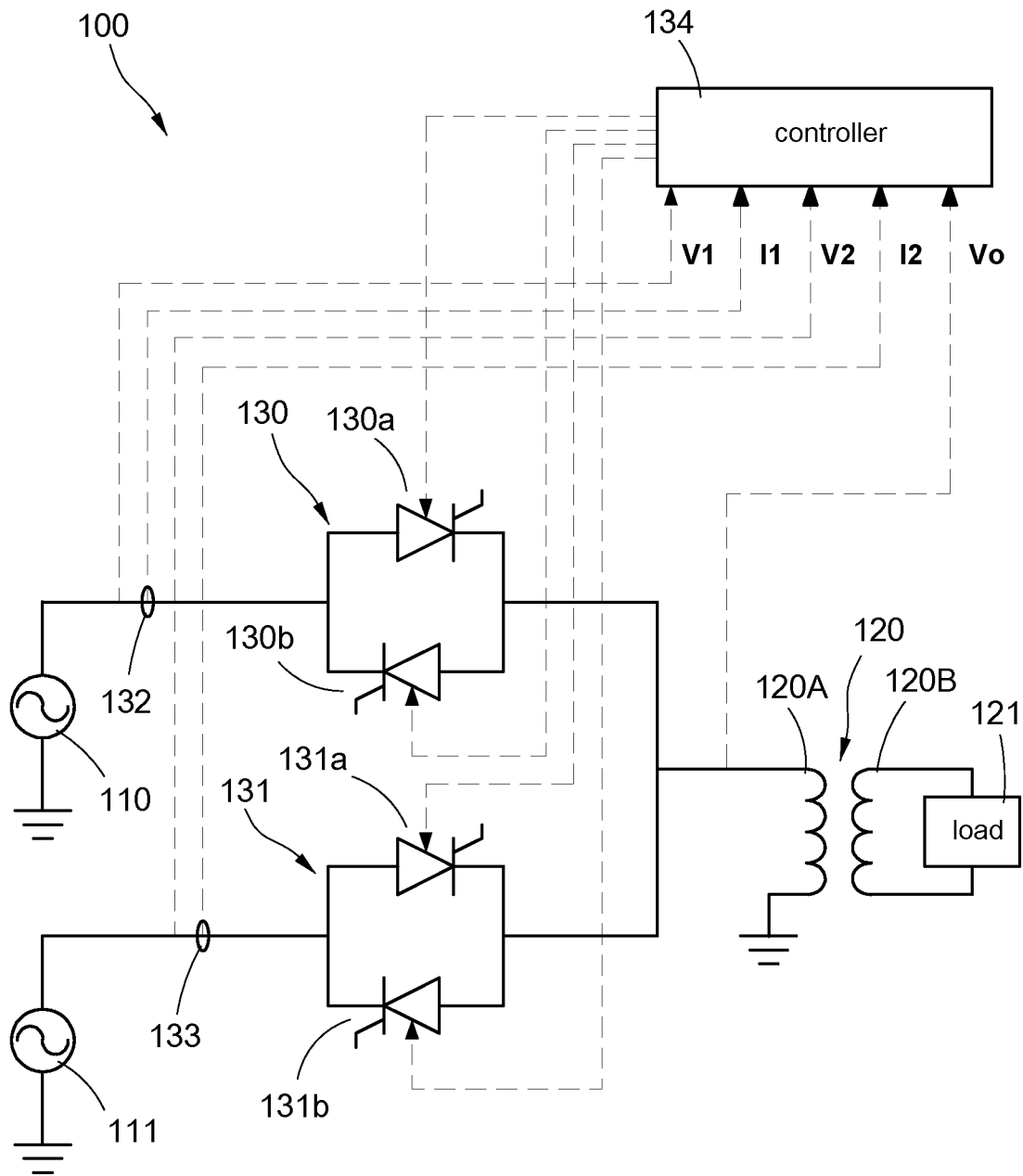
FIG. 2A is a block circuit diagram of a dual power switching system according to the present disclosure.

Please refer to FIG. 2A, which shows a block circuit diagram of a dual power switching system according to the present disclosure. The dual power switching system 100 is used to supply power to a critical load 121, and the dual power switching system 100 includes a static transfer switch apparatus, an inductive device 120, and a controller 134. The static transfer switch apparatus includes a first static transfer switch 130 and a second static transfer switch 131. The critical load 121 (hereinafter referred to as the load), for example, but not limited to, may be a server, a communication system, etc. that need to uninterruptedly and continuously operate. The first static transfer switch 130 is electrically coupled to a main power source 110, and the second static transfer switch 131 is electrically coupled to a backup power source 111. The inductive device 120 includes a first side winding 120A and a second side winding 120B. The first side winding 120A is electrically coupled to the first static transfer switch 130 and the second static transfer switch 131, and the second side winding 120B is electrically coupled to the load 121. The controller 134 detects the main power source 110 and an output power of the backup power source 111, and acquires a predicted magnetic flux corresponding to the inductive device 120. In particular, the controller 134 may be, for example, but not limited to, a digital signal processor (DSP). Any physical circuit that can use a signal to control the circuit, a control device including control software, etc., should all be included in the scope of this embodiment.

Specifically, the dual power switching system 100 further includes voltage sensors (not shown) and current sensors 132, 133. The voltage sensors and the current sensors 132, 133 are respectively electrically coupled to the main power source 110 and the backup power source 111 for respectively detecting voltage signals V1, V2 and current signals I1, I2 (i.e., for example, but not limited to, the output power) corresponding to the main power source 110 and the backup power source 11. The voltage sensors are further electrically coupled to the first side winding 120A or the second side winding 120B of the inductive device 120 for detecting a voltage signal Vo corresponding to the output power of the first side winding 120A.

Figure 2B:
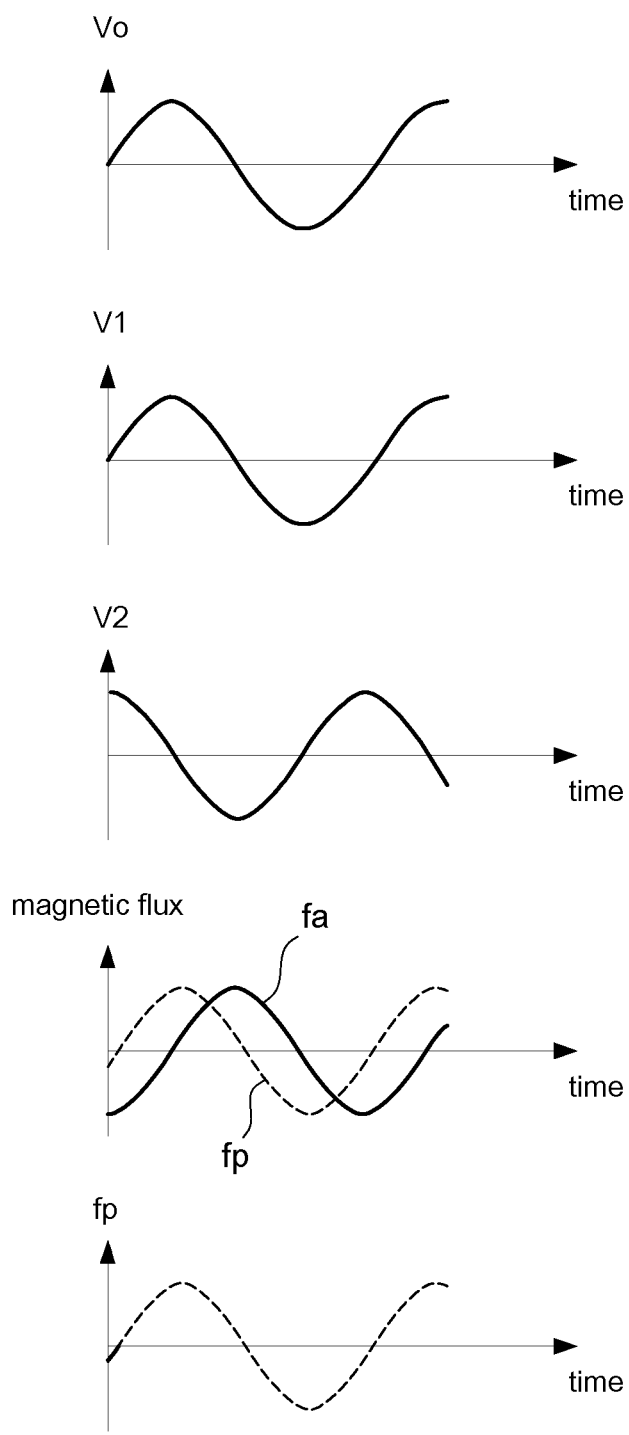
FIG. 2B is a waveform of operating a main power source, a backup power source, and an output power source according to the present disclosure.

Please refer to FIG. 2B, which shows a waveform of operating a main power source, a backup power source, and an output power source according to the present disclosure. Although the voltage waveform of the main power source 110 and that of the backup power source 111 has a phase difference, they are only for illustration and are not related to each other, that is, the switching control method of the present disclosure mainly controls the magnetic flux, regardless of the magnitude of the phase difference. In one embodiment, the main power source 110 first supplies power to the load 121, and the backup power source 111 is used for replacing the main power source 110 when the main power source 110 is insufficient or unavailable. The controller 134 acquires the voltage signals V1, V2, Vo and integrates the voltage signals V1, V2, Vo to acquire predicted magnetic flux fp corresponding to the main power source 110 and the backup power source 111, and an actual magnetic flux fa corresponding to the inductive device 120. In particular, the predicted magnetic flux fp is the integration of the voltage signal V2, and the actual magnetic flux fa is the integration of the voltage signal Vo. Since the first static transfer switch 130 is turned on and the main power source 110 is connected to the inductive device 120, the magnetic flux of the main power source 110 is identical to the magnetic flux of the inductive device 120 (i.e., the actual magnetic flux fa). Since the integration of the voltage is the magnetic flux, and the integration of the sinusoidal wave is still a sinusoidal wave, the predicted magnetic flux fp and the actual magnetic flux fa are still sinusoidal waveforms.

Please refer to FIG. 2A again, the first static transfer switch 130 and the second static transfer switch 131 respectively include a plurality of silicon-controlled rectifiers (SCRs). The silicon-controlled rectifiers 130a, 130b of the first static transfer switch 130 are anti-parallel connected, and the silicon-controlled rectifiers 131a, 131b of the second static transfer switch 131 are anti-parallel connected. Since the silicon-controlled rectifier has current flowing, the controller 134 cannot turn off the silicon-controlled rectifier through a gate end of the silicon-controlled rectifier, the silicon-controlled rectifier will be turned off only after the silicon-controlled rectifier freewheels to naturally zero or uses forced commutation to cancel the anode current. Therefore, the present disclosure provides at least two methods for turning off the silicon-controlled rectifier. One of the two methods is to use another power source to reverse bias the silicon-controlled rectifier to turn it off. The other of the two methods is to use an additional circuit called an active commutation circuit to turn off the activated silicon-controlled rectifier, which provides additional DC power to reverse-bias the silicon-controlled rectifier to forcibly turn off the silicon-controlled rectifier. The detailed circuits and control methods of the two turned-off manners will be further described later, and will not be repeated here.

The main purpose and effect of the present disclosure is that the controller 134 is used to continuously calculate the predicted magnetic flux acquired in the downstream inductive device 120 (such as, but not limited to, inductive components such as transformers) in real time. If a power failure event occurs (for example, but not limited to, the main power source 110 is abnormal), the controller 134 turns off the silicon-controlled rectifiers 130a, 130b on the working path of the main power source 110, and the silicon-controlled rectifiers 131a, 131b on the backup path (i.e., the backup power source 111) are then turned on according to the current calculated magnetic flux and according to the specific timing sequence designed by the present disclosure so as to avoid improper switching between the two power sources causing high inrush current in the downstream inductive device 120. Also, at the same time to avoid the output power dropping too low due to waiting for the freewheeling current of the silicon-controlled rectifier to reach zero, which is insufficient to keep the load 121 stable operating condition. The controller 134 determines that the first static transfer switch 130 to be turned on or turned off according to a first current (i.e., corresponding to the current signal I1) flowing through the first static transfer switch 130 sensed by the current sensor 132. In other words, the controller 134 can confirm whether the first static transfer switch 130 is correctly turned on/off through the first current (i.e., corresponding to the current signal I1) so as to confirm whether the entire dual power switching system 100 normally operates. Similarly, the controller 134 can confirm whether the second static transfer switch 131 is correctly turned on/off through a second current (i.e., corresponding to the current signal I2) so as to confirm whether the entire dual power switching system 100 normally operate.

Figure 3A:
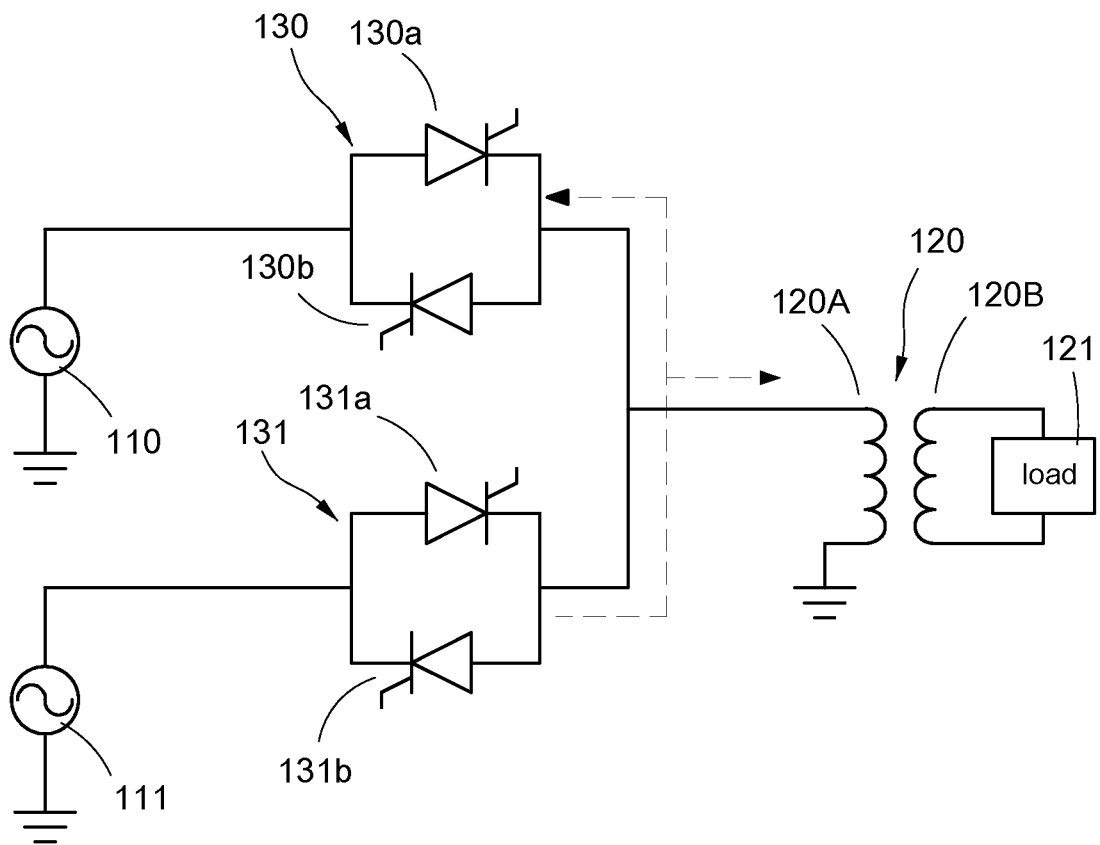
FIG. 3A is a block circuit diagram of the dual power switching system using a first switching method according to the present disclosure.
Figure 3B:
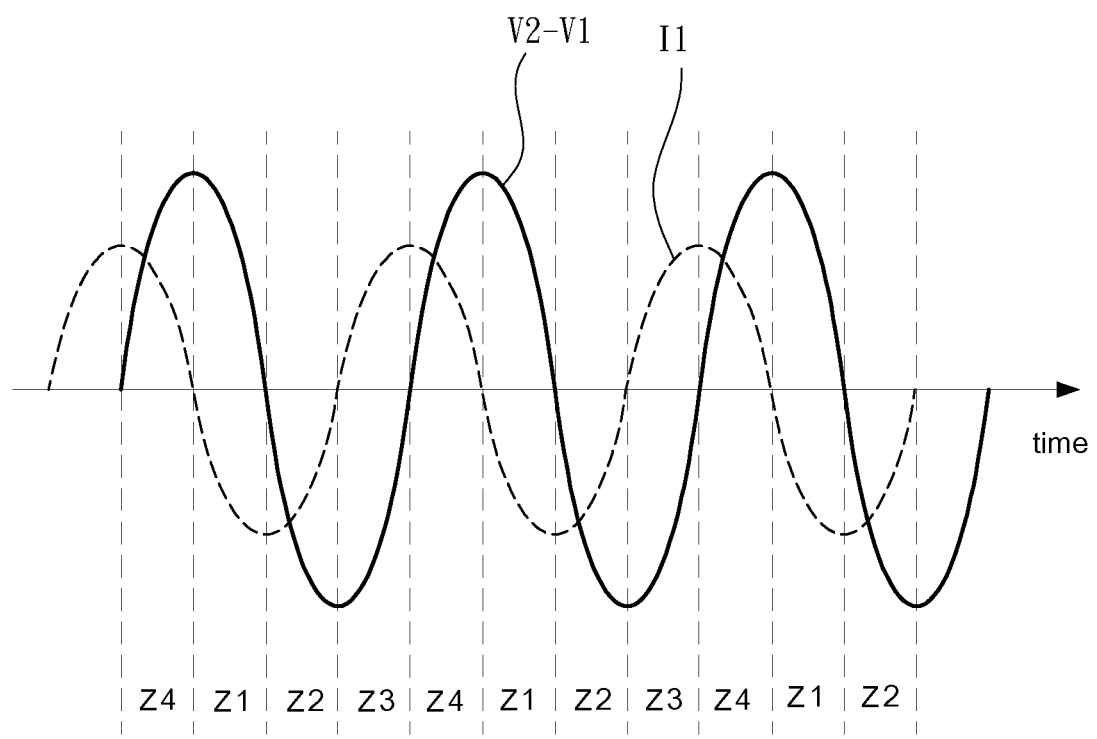
FIG. 3B is a waveform of voltages and currents of the dual power switching system using the first switching method according to the present disclosure.

Please refer to FIG. 3A and FIG. 3B, which show a block circuit diagram of the dual power switching system using a first switching method and using a second switching method according to the present disclosure, and also refer to FIG. 2A and FIG. 2B. In this embodiment, the main control method of turning off the silicon-controlled rectifier is to use another power source to reverse-bias the silicon-controlled rectifier to forcibly turn off the silicon-controlled rectifier. Taking the backup power source 111 to turn off the main power source 110 as an example, when the controller 134 detects that the main power source 110 is abnormal, the controller 134 determines whether the output power meets a forced commutation condition. The forced commutation condition is that when the controller 134 turns on the second static transfer switch 131, the power provided by the backup power source 111 happens to cause the first static transfer switch 130 to be reverse biased and turned off, thereby forcibly turning off the first static transfer switch 130.

Please refer to FIG. 3B, the current sensor 132 is used for monitoring the current flowing through the first static transfer switch 130, and the other current sensor 133 is used for monitoring the current flowing through the second static transfer switch 131. The controller 134 can determine which switch of the first static transfer switch 130 conducts the current to the load 121 according to the current signal I1. When the current is positive, it means that the silicon-controlled rectifier 130a is conducting current to the load 121, and when the current is negative, it means that the silicon-controlled rectifier 130b is conducting current to the load 121. The voltage difference V2−V1 is used to determine whether the controller 134 can control the second static transfer switch 131 to be turned on. Therefore, four regions Z1 to Z4 shown in FIG. 3B are divided, and the regions that can control the conduction of the second static transfer switch 131 are shown in the following Table 1.

TABLE 1

|  | Zone 1 | Zone 2 | Zone 3 | Zone 4 |
| --- | --- | --- | --- | --- |
| V2 − V1 | + | − | − | + |
| I1 | − | − | + | + |
| switching timing | No | Yes | No | Yes |

Specifically, as shown in the table above, the controller 134 can detect whether the voltage difference V2−V1 between the main power source 110 and the backup power source 111 is a positive voltage difference (i.e., zones Z1, Z4) or a negative voltage difference (i.e., zones Z2, Z3) by voltage sensors. When the silicon-controlled rectifier 130a conducts current to the load 121 (i.e., the current is positive), and the voltage difference V2−V1 is positive, the controller 134 turns on the second static transfer switch 131 so that the backup power source 111 forcibly turns off the first static transfer switch 130 through the second static transfer switch 131. Alternatively, when the silicon-controlled rectifier 130b conducts current to the load 121 (i.e., the current is negative), and the voltage difference V2−V1 is negative, the controller 134 turns on the second static transfer switch 131 so that the power provided by the backup power source 111 can be reverse biased to turn off the first static transfer switch 130. On the contrary, when the silicon-controlled rectifier 130a conducts current to the load 121 (i.e., the current is positive), and the voltage difference V2−V1 is negative, the controller 134 confirms that the output power does not meet the forced commutation condition. Alternatively, when the silicon-controlled rectifier 130b conducts current to the load 121 (i.e., the current is negative), and the voltage difference V2−V1 is positive, the controller 134 confirms that the output power does not meet the forced commutation condition.

Figure 4:
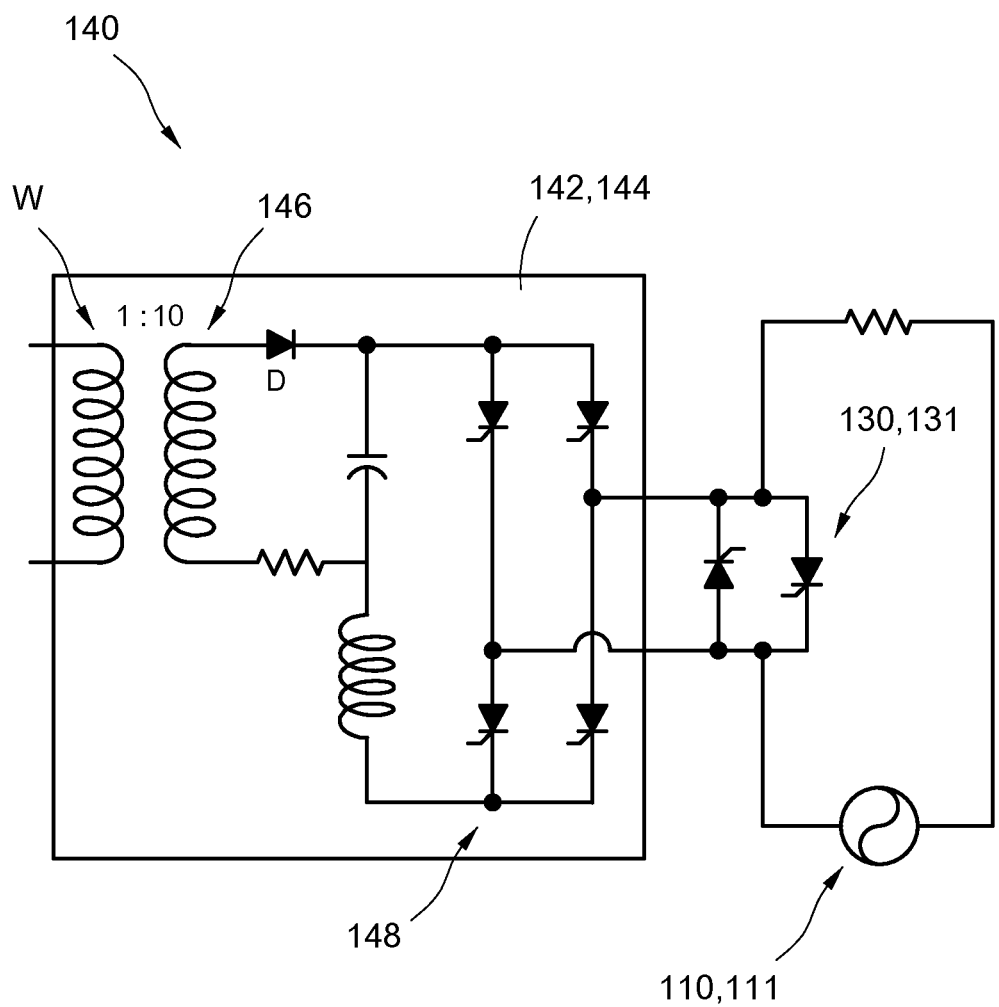
FIG. 4 is a block circuit diagram of the dual power switching system using a second switching method according to the present disclosure.

Please refer to FIG. 4, which shows a block circuit diagram of the dual power switching system using a second switching method according to the present disclosure, and also refer to FIG. 2A to FIG. 3B. In this embodiment, the main control method of turning off the silicon-controlled rectifier is to use an additional circuit called an active commutation circuit (hereinafter referred to as a forced commutation circuit 140) to turn off the activated silicon-controlled rectifier 130a, 130b. The forced commutation circuit 140 is electrically coupled to the first static transfer switch 130 and the second static transfer switch 131, and applies a reverse-bias voltage to the silicon-controlled rectifiers 130a-131b to forcibly turn off the silicon-controlled rectifiers 130a-131b. In particular, the forced commutation circuit 140 can receive an external power source to convert the external power source to apply the reverse bias voltage to the silicon-controlled rectifiers 130a-131b. Alternatively, the forced commutation circuit 140 may be internally powered.

FIG. 4 shows a preferred circuit implementation in which the forced commutation circuit 140 is internally powered, but is not limited thereto. The forced commutation circuit 140 is electrically coupled to the first side winding 120A of the inductive device 120. When the main power source 110 is abnormal, the forced commutation circuit 140 generates the reverse bias voltage by receiving and converting a voltage of the first side winding 120A. Specifically, the forced commutation circuit 140 includes a first driver 142 and a second driver 144. The first driver 142 is electrically coupled to the first static transfer switch 130, and the second driver 144 is electrically coupled to the second static transfer switch 131. The circuit structure and coupling relationship of the second driver 144 are the same as those of the first driver 142, and details are not repeated here.

The first driver 142 and the second driver 144 respectively include a conversion winding 146, a rectifying diode D, and a driver circuit 148. The conversion winding is electrically coupled to the transformer winding W. The rectifying diode D includes an anode and a cathode, and the anode is electrically coupled to the conversion winding 146. The driver circuit 148 includes a plurality of silicon-controlled rectifiers (or replaced by diodes), and the silicon-controlled rectifiers form a half-bridge or full-bridge rectifying circuit. The driver circuit 148 of the first driver 142 is electrically coupled between the cathode of the rectifying diode D of the first driver 142 and the first static transfer switch 130. Similarly, the driver circuit 148 of the second driver 144 is electrically coupled between the cathode of the rectifying diode D of the second driver 144 and the second static transfer switch 131.

Taking the backup power source 111 to turn off the main power source 110 as an example, when the controller 134 detects that the main power source 110 is abnormal, the controller 134 activates the forced commutation circuit 140, and the forced commutation circuit 140 generates and provides the reverse bias voltage by receiving the voltage of the transformer winding W so as to forcibly turn off the first static transfer switch 130. After the first static transfer switch 130 is forcibly turned off (detected by the current sensor 132), the controller 134 turns on the second static transfer switch 131 to control the backup power source 111 to be supplied to the inductive device 120 through the second static transfer switch 131. In one embodiment, the external power source may be any power source, including an additional power source, or a power source acquired by electrically coupling to the main power source 110, the backup power source 111, and the like.

Figure 5A:
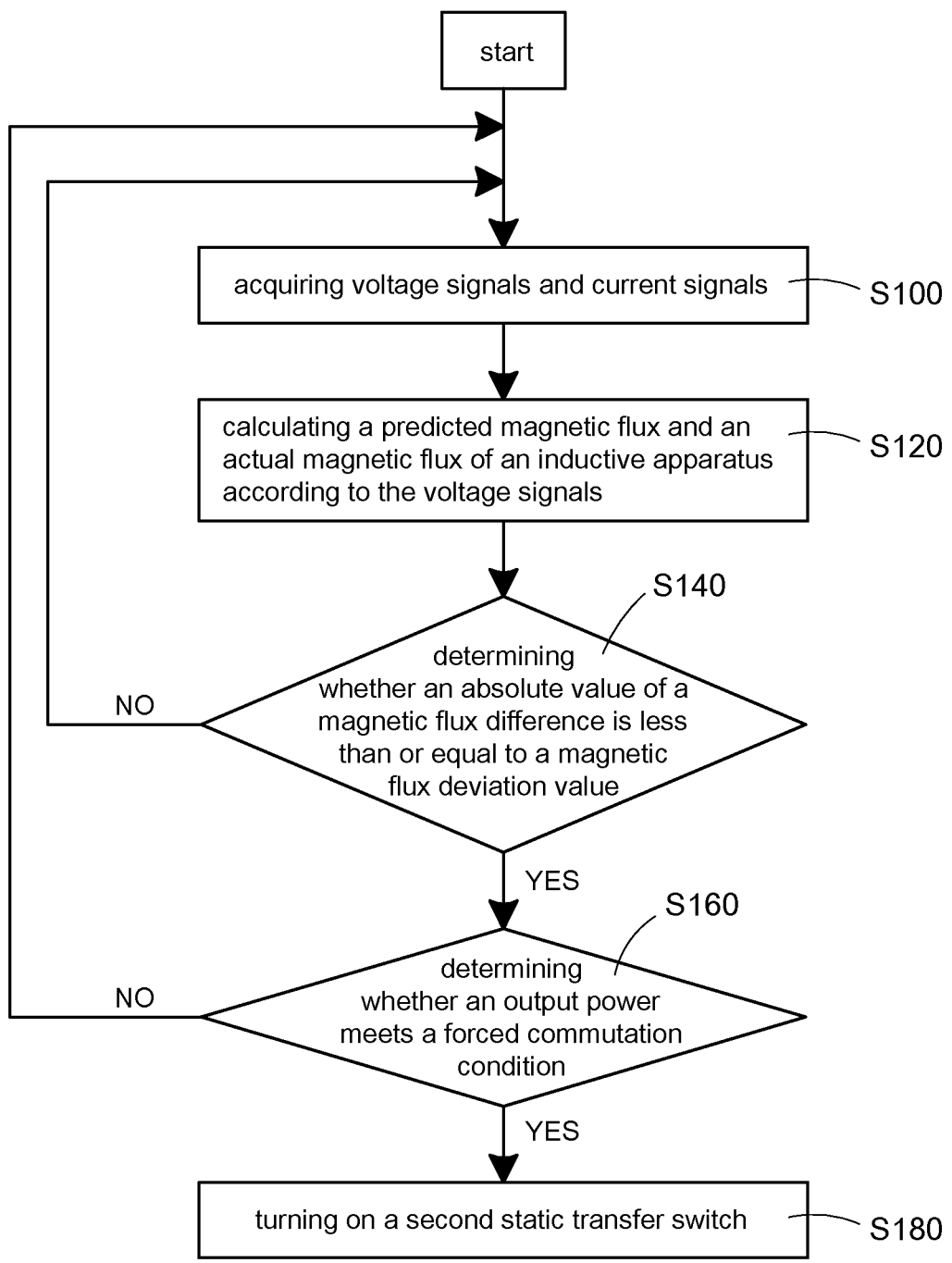
FIG. 5A is a flowchart of a method of controlling the dual power switching system according to a first embodiment of the present disclosure.

Please refer to FIG. 5A, which shows a flowchart of a method of controlling the dual power switching system according to a first embodiment of the present disclosure, also refer to FIG. 2A to FIG. 4. The control method of FIG. 5A is matched with the reverse bias method of FIG. 3A, and the waveform diagram of the switching control method may be referred to in matched with FIG. 6A. In one embodiment, the main power source 110 first supplies power to the load 121, and the backup power source 111 is used for replacing the main power source 110 when the main power source 110 is insufficient or unavailable. First, the controller 134 operates the STS apparatus so that the main power source 110 is electrically conducted to the inductive device 120 through the STS apparatus, that is, the main power source 110 is electrically coupled to the inductive device 120 by electrically turning on the first static transfer switch 130. When the controller 134 detects that the main power source 110 is abnormal (time t1), steps of switching control are performed. In step (S100), the controller 134 acquires voltage signals V1, V2, Vo and current signals I1, I2. In step (S120), the controller 134 calculates the predicted magnetic flux fp and the predicted magnetic flux fa of the inductive device 120 (i.e., the magnetic flux of the main power source 110) according to the voltage signals V1, V2, Vo. In step (S140), an absolute value of a magnetic flux difference $\Delta\Phi$ is determined whether to be less than or equal to a magnetic flux deviation value.

When the controller 134 detects that the main power source 110 is abnormal, the controller 134 detects the residual magnetic flux of the inductive device 120. In particular, the residual magnetic flux (i.e., the actual magnetic flux fa) means the residual magnetic flux on the inductive device 120 when the main power source 110 is abnormal. The controller 134 can usually acquire the residual magnetic flux by detecting the residual voltage on the first side winding 120A, and can also acquire the residual magnetic flux by detecting the residual voltage on the second side winding 120B connected to the load 121. When the main power source 110 is abnormal, the absolute value of the voltage begins to decrease (time t1 to time t2 shown in FIG. 6A) so that the residual magnetic flux is maintained in a steady-state slow-rising wave, which is approximately equal to the DC waveform (usually within 5% of the fluctuation range). Afterward, the controller 134 calculates the magnetic flux difference $\Delta\Phi$ between the predicted magnetic flux fp and the residual magnetic flux (i.e., the actual magnetic flux fa), and the magnetic flux difference $\Delta\Phi$ is the difference between the sinusoidal waveform and the rising wave. Since the controller 134 controls the backup power source 111 to replace the main power source 110 to supply power, the predicted magnetic flux fp mainly refer to the magnetic flux of the backup power source 111.

Afterward, in step (S160), the controller 134 determines whether the output power meets a forced commutation condition according to Table 1. In particular, the magnetic flux deviation value is a fixed value preset by the controller 134. The fixed value is usually set according to the standard that the voltage and current of the output power source can still be maintained within a specific range when the dual power sources are switched. The specific range is such as, but not limited to, voltage above 70%, inrush current below 400%, in compliance with CBEMA/ITIC standards. When the determination of step (S160) is "Yes", the controller 134 turns on the second static transfer switch 131 (S180, time t2) so that the backup power source 111 forcibly turns off the first static transfer switch through the second static transfer switch 131, and simultaneously supplies power to the load 121. In other words, the backup power source 111 electrically turns on the inductive device 120 through the static transfer switch apparatus STS, (i.e., the second static transfer switch 131 is turned on), and drives the static transfer switch apparatus STS to forcibly disconnect a path between the main power source 110 and the inductive device 120. Therefore, when the main power source 110 is abnormal, the absolute value of the magnetic flux difference ΔΦ changes from greater than to less than or equal to the magnetic flux deviation value (time t1 to time t2 shown in FIG. 6A). Therefore, it is a better timing to perform the switching of the static transfer switch at time t2. In addition to maintaining the speed of dual power switching, it can also avoid the voltage and current of the output power source exceeding a specific range. In particular, when the determination of steps (S140) and (S160) is "No", the process returns to the step (S100) to continuously determines whether the absolute value of the magnetic flux difference ΔΦ is less than or equal to the magnetic flux deviation value.

Figure 5B:
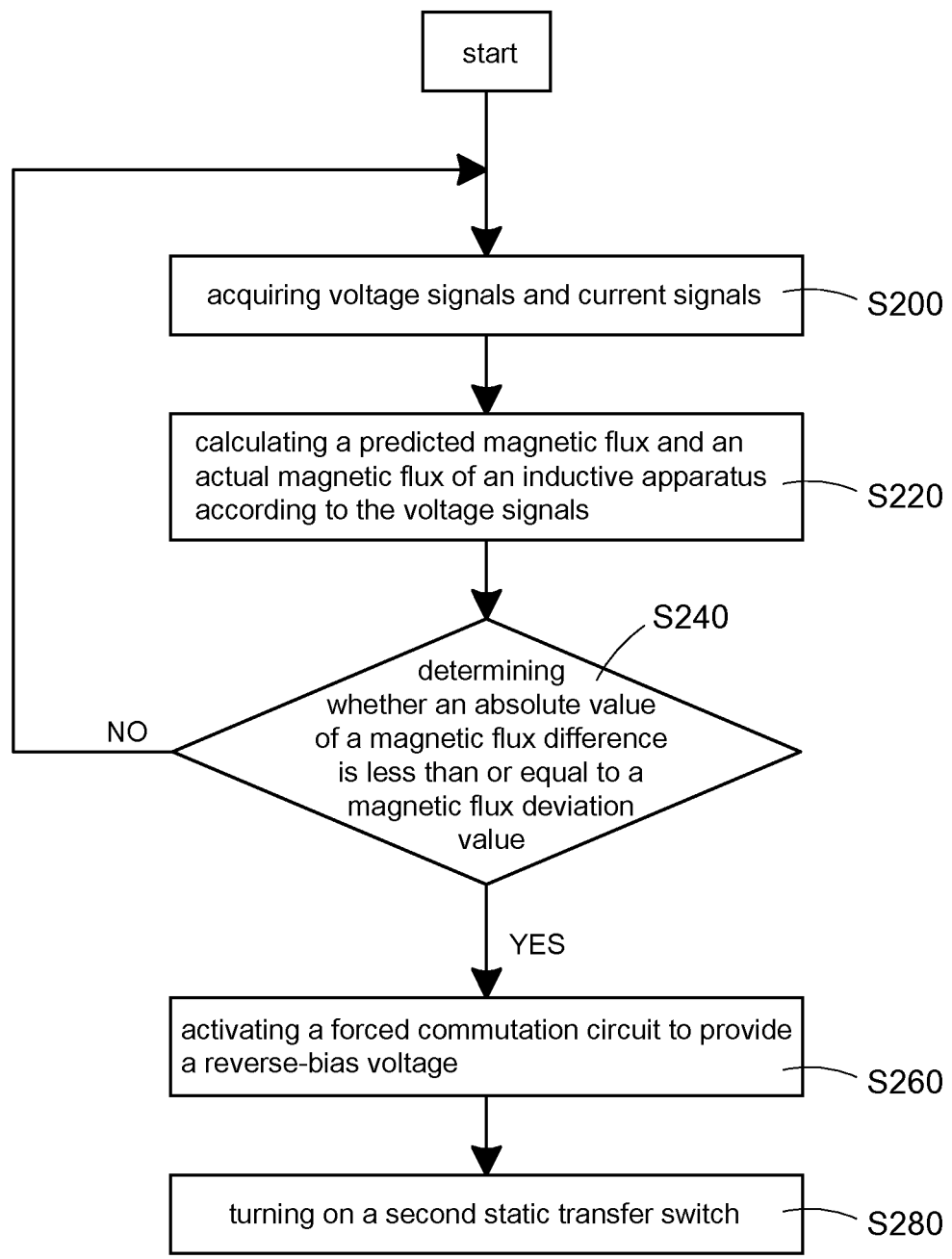
FIG. 5B is a flowchart of the method of controlling the dual power switching system according to a second embodiment of the present disclosure.
Figure 6A:
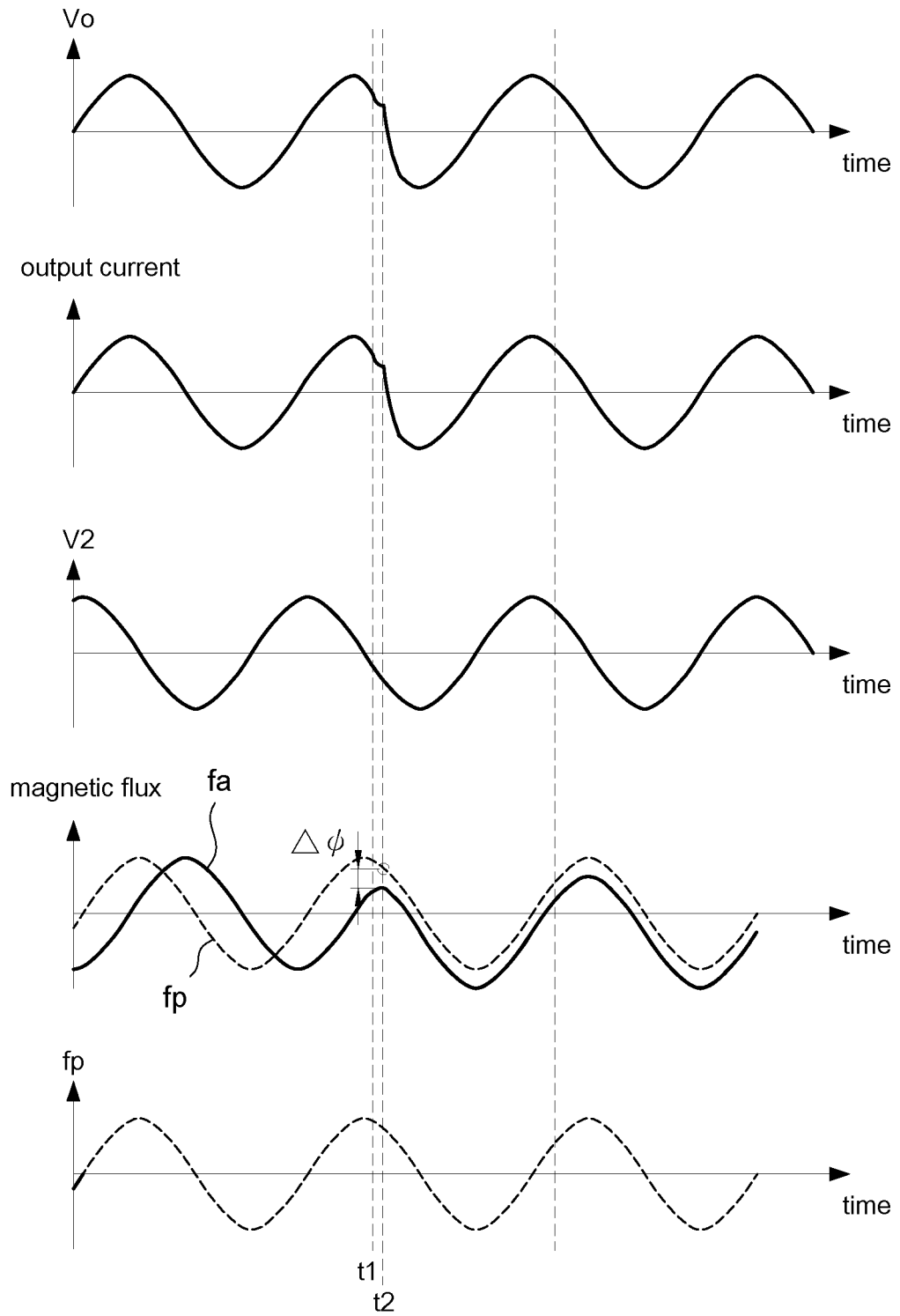
FIG. 6A is a waveform of the method of controlling the dual power switching system according to the first embodiment of the present disclosure.

Please refer to FIG. 5B, which shows a flowchart of the method of controlling the dual power switching system according to a second embodiment of the present disclosure, in conjunction with the reverse bias method of FIG. 4, and the waveform diagram may also be referred to FIG. 6A. In one embodiment, the main power source 110 first supplies power to the load 121, and the backup power source 111 is used for replacing the main power source 110 when the main power source 110 is insufficient or unavailable. In step (S200) of FIG. 5B, the controller 134 acquires the voltage signals V1,V2,Vo and the current signals I1,I2. In step (S220), the controller 134 calculates the predicted magnetic flux fp and the actual magnetic flux fa (i.e., the magnetic flux of the main power source 110) according to the voltage signals V1,V2,Vo. In step (S240), the absolute value of a magnetic flux difference ΔΦ is determined whether to be less than or equal to the magnetic flux deviation value. In particular, the magnetic flux deviation value is a fixed value preset by the controller 134. The fixed value is usually set according to the standard that the voltage and current of the output power source can still be maintained within a specific range when the dual power sources are switched. The specific range is such as, but not limited to, voltage above 70%, inrush current below 400%, in compliance with CBEMA/ITIC standards. When the determination of step (S240) is "Yes", the controller 134 activates the forced commutation circuit 140 to provide a reverse bias voltage (S260) to forcibly turn off the first static transfer switch 130 (time t2 shown in FIG. 6A). After the first static transfer switch 130 is turned off, step (S280) is performed to turn on the second static transfer switch 131. When the determination of step (S240) is "No", the process returns to the step (S2000) to continuously detect the best switching timing.

Figure 6B:
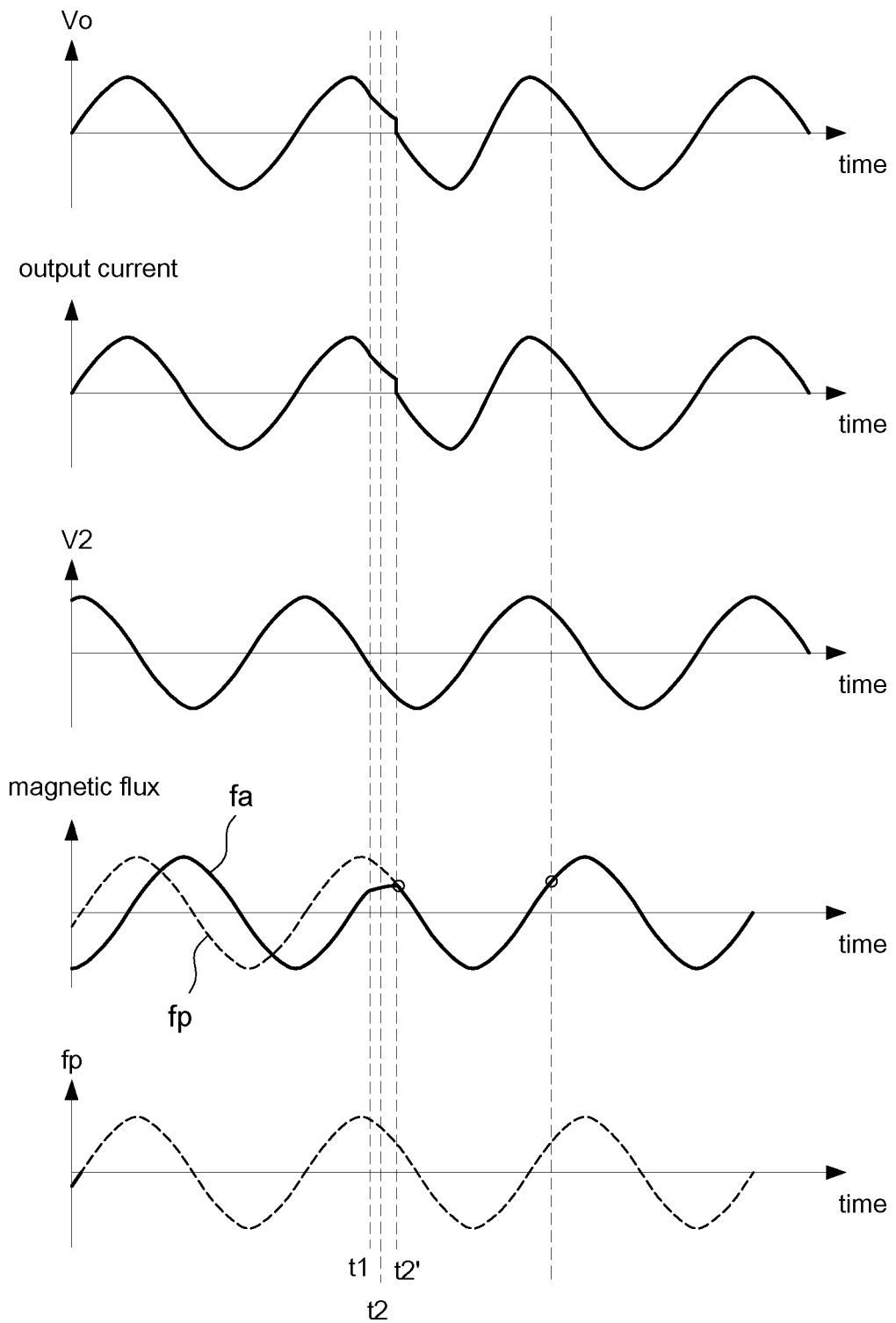
FIG. 6B is a waveform of the method of controlling the dual power switching system according to the second embodiment of the present disclosure.

Please refer to FIG. 6B, which shows a waveform of the method of controlling the dual power switching system according to the second embodiment of the present disclosure, and also refer to FIG. 2A to FIG. 6A. The embodiment of FIG. 6B is also applicable to the reverse bias methods of FIG. 3A and FIG. 4 and applicable to the control methods of FIG. 5A and FIG. 5B. The difference between in FIG. 6B and FIG. 6A is that the flux deviation value of FIG. 6B is set to 0, and therefore the timing when the controller 134 turns on the second static transfer switch 131 is delayed from time t2 in FIG. 6A to time t2' in FIG. 6B. Although the switching timing of the static transfer switch is later than that in FIG. 6A, there is almost no magnetic flux deviation so that although the voltage of the output power source is low, the current can be suppressed in a smaller range.

Figure 7:
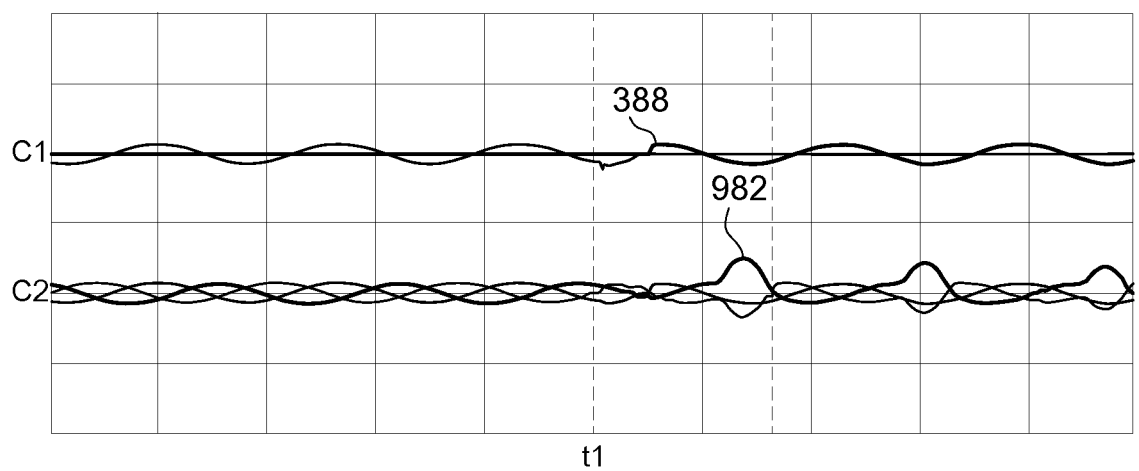
FIG. 7 is a schematic measured waveforms of the dual power switching system according to the present disclosure.

Please refer to FIG. 7, which shows a schematic measured waveforms of the dual power switching system according to the present disclosure, and also refer to FIG. 2A to FIG. 6B. In the measured waveforms, C1 is the output voltage waveform, and C2 is the output current waveform. When the main power source 110 is abnormal at time t1, the measured output voltage after time t1 is at least 388 volts, and the output current is at most 982 amps. Compared with the 70% voltage (i.e., 336 volts) set in the specific range, the surge current of 400% (1361 amps) still has enough margin, and therefore it meets the standard of CBEMA/ITIC, and the switching time of dual power source is maintained in ½ cycles, or even within ¼ cycles.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A dual power switching system, comprising:
a first static transfer switch, electrically coupled to a main power source,
a second static transfer switch, electrically coupled to a backup power source,
an inductive device, comprising a first side winding and a second side winding, wherein the first side winding is electrically coupled to the first static transfer switch and the second static transfer switch, and the second side winding is electrically coupled to a load, and
a controller, configured to detect an output power of the main power source and an output power of the backup power source, and acquire a predicted magnetic flux corresponding to the inductive device,
wherein when the controller detects that the main power source is abnormal, the controller detects a residual magnetic flux of the inductive device and calculates a magnetic flux difference between the predicted magnetic flux and the residual magnetic flux,
wherein when the controller determines that an absolute value of the magnetic flux difference is less than or equal to a magnetic flux deviation value, the controller determines whether the output power meets a forced commutation condition wherein the magnetic flux deviation value is a non-zero value set by the controller,
wherein when the controller determines that the output power meets the forced commutation condition, the controller turns on the second static transfer switch so that the first static transfer switch is forcibly turned off by the backup power source through the second static transfer switch.

2. The dual power switching system as claimed in claim 1, wherein the controller further detects a voltage difference between the main power source and the backup power source as a positive voltage difference or a negative voltage difference, and detects a main current outputted from the main power source as a positive current or a negative current,
wherein when the controller detects that the voltage difference is the positive voltage difference and the main current is the positive current, the controller determines that the output power meets the forced commutation condition, or when the controller detects that the voltage difference is the negative voltage difference and the main current is the negative current, the controller determines that the output power meets the forced commutation condition.

3. The dual power switching system as claimed in claim 2, wherein
when the controller detects that the voltage difference is the positive voltage difference and the main current is the negative current, the controller determines that the output power does not meet the forced commutation condition, or
when the controller detects that the voltage difference is the negative voltage difference and the main current is the positive current, the controller determines that the output power does not meet the forced commutation condition.

4. The dual power switching system as claimed in claim 1, wherein the predicted magnetic flux is a sinusoidal waveform, and the magnetic flux deviation value is a fixed value preset by the controller.

5. The dual power switching system as claimed in claim 4, wherein the residual magnetic flux is a steady slow-rising wave, and a difference between the sinusoidal waveform and the steady slow-rising wave is the magnetic flux difference,
wherein when the main power source is abnormal, the absolute value of the magnetic flux difference varies from greater than to less than or equal to the magnetic flux deviation value.

6. The dual power switching system as claimed in claim 1, wherein when the main power source is abnormal, the controller acquires the residual magnetic flux by detecting a residual voltage of the first side winding.

7. The dual power switching system as claimed in claim 1, wherein the first static transfer switch and the second static transfer switch respectively comprise a plurality of anti-parallel silicon-controlled rectifiers.

8. The dual power switching system as claimed in claim 1, further comprising:
a first current sensor, electrically coupled to the main power source, and
a second current sensor, electrically coupled to the backup power source,
wherein the controller detects a first current flowing through the first static transfer switch by the first current sensor to determine whether the first static transfer switch is turned on or turned off, and the controller detects a second current flowing through the second static transfer switch by the second current sensor to determine whether the second static transfer switch is turned on or turned off.

9. A dual power switching system, comprising:
a first static transfer switch, electrically coupled to a main power source,
a second static transfer switch, electrically coupled to a backup power source,
an inductive device, comprising a first side winding and a second side winding, wherein the first side winding is electrically coupled to the first static transfer switch and the second static transfer switch, and the second side winding is electrically coupled to a load,
a forced commutation circuit, electrically coupled to the first static transfer switch and the second static transfer switch, and
a controller, configured to detect an output power of the main power source and an output power of the backup power source, and acquire a predicted magnetic flux corresponding to the inductive device,
wherein when the controller detects that the main power source is abnormal, the controller detects a residual magnetic flux of the inductive device and calculates a magnetic flux difference between the predicted magnetic flux and the residual magnetic flux,
wherein when the controller determines that an absolute value of the magnetic flux difference is less than or equal to a magnetic flux deviation value, the controller activates the forced commutation circuit to provide a reverse-bias voltage to forcibly turn off the first static transfer switch, and after the first static transfer switch is forcibly turned off, the controller turs on the second static transfer switch wherein the magnetic flux deviation value is a non-zero value set by the controller.

10. The dual power switching system as claimed in claim 9, wherein the forced commutation circuit is electrically coupled to a transformer winding of an external power source,
wherein when the main power source is abnormal, the forced commutation circuit generates the reverse-bias voltage by receiving a voltage of the transformer winding.

11. The dual power switching system as claimed in claim 10, wherein the forced commutation circuit comprises a first driver and a second driver, and the first driver and the second driver respectively comprise:
a conversion winding, electrically coupled to the transformer winding,
a rectifying diode, comprising an anode and a cathode, and the anode electrically coupled to the conversion winding, and
a driver circuit,
wherein the driver circuit of the first driver is electrically coupled between the cathode of the rectifying diode of the first driver and the first static transfer switch, and
wherein the driver circuit of the second driver is electrically coupled between the cathode of the rectifying diode of the second driver and the second static transfer switch.

12. The dual power switching system as claimed in claim 11, wherein each driver circuit comprises a plurality of silicon-controlled rectifiers, and the silicon-controlled rectifiers form a rectifying circuit.

13. A method of controlling a dual power switching system, wherein the dual power switching system comprises a main power source, a static transfer switch apparatus, and a backup power source, the method comprising steps of:
electrically conducting an inductive device by the main power source through the static transfer switch apparatus by operating the static transfer switch apparatus, and suppling power of the main power source to a load electrically coupled to the inductive device,
detecting an output power of the main power source and an output power of the backup power source, and acquiring a predicted magnetic flux corresponding to the inductive device,
detecting a residual magnetic flux of the inductive device and calculating a magnetic flux difference between the predicted magnetic flux and the residual magnetic flux when the main power source is abnormal,
determining whether the output power meets a forced commutation condition when an absolute value of the magnetic flux difference is less than or equal to a magnetic flux deviation value,
electrically conducting the inductive device by the backup power source through the static transfer switch apparatus by operating the static transfer switch apparatus when the output power meets the forced commutation condition, and driving the static transfer switch apparatus by the backup power source to forcibly disconnect a path between the main power source and the inductive device.

14. The method of controlling the dual power switching system as claimed in claim 13, further steps of:

detecting a voltage difference between the main power source and the backup power source as a positive voltage difference or a negative voltage difference, and detecting a main current outputted from the main power source as a positive current or a negative current, wherein determining that the output power meets the forced commutation condition when the voltage difference is the positive voltage difference and the main current is the positive current, or determining that the output power meets the forced commutation condition when the voltage difference is the negative voltage difference and the main current is the negative current.

15. The method of controlling the dual power switching system as claimed in claim 14, wherein determining that the output power does not meet the forced commutation condition when the voltage difference is the positive voltage difference and the main current is the negative current, or determining that the output power does not meet the forced commutation condition when the voltage difference is the negative voltage difference and the main current is the positive current.

* * * * *